United States Patent
Xu et al.

[11] Patent Number: 6,034,448
[45] Date of Patent: Mar. 7, 2000

[54] SEMICONDUCTOR SWITCH

[75] Inventors: Chihao Xu; Rainald Sander, both of Munich, Germany

[73] Assignee: Siemens Aktiengesellschaft, Munich, Germany

[21] Appl. No.: 09/159,720

[22] Filed: Sep. 24, 1998

[30] Foreign Application Priority Data

Sep. 24, 1997 [DE] Germany ............................. 19742169

[51] Int. Cl.$^7$ ................................................. H02B 1/24
[52] U.S. Cl. ............................................................ 307/127
[58] Field of Search ................................. 307/127, 125, 307/130; 361/82, 84; 320/165

[56] References Cited

U.S. PATENT DOCUMENTS 5,847,911 12/1998 Van Reenen ............................. 361/84

Primary Examiner—Richard T. Elms
Attorney, Agent, or Firm—Hill & Simpson

[57] ABSTRACT

A semiconductor switch, particularly an MOS high-side power switch, having at least one power transistor for driving a load, and having a circuit for driving the power transistor via an external control signal by activating the power transistor over its gate. In order to also assure low dissipated power of the MOS power transistor given a reversal of the power supply, an auxiliary circuit is provided for the activation of the MOS power transistor via its gate given upon such reversal.

7 Claims, 1 Drawing Sheet

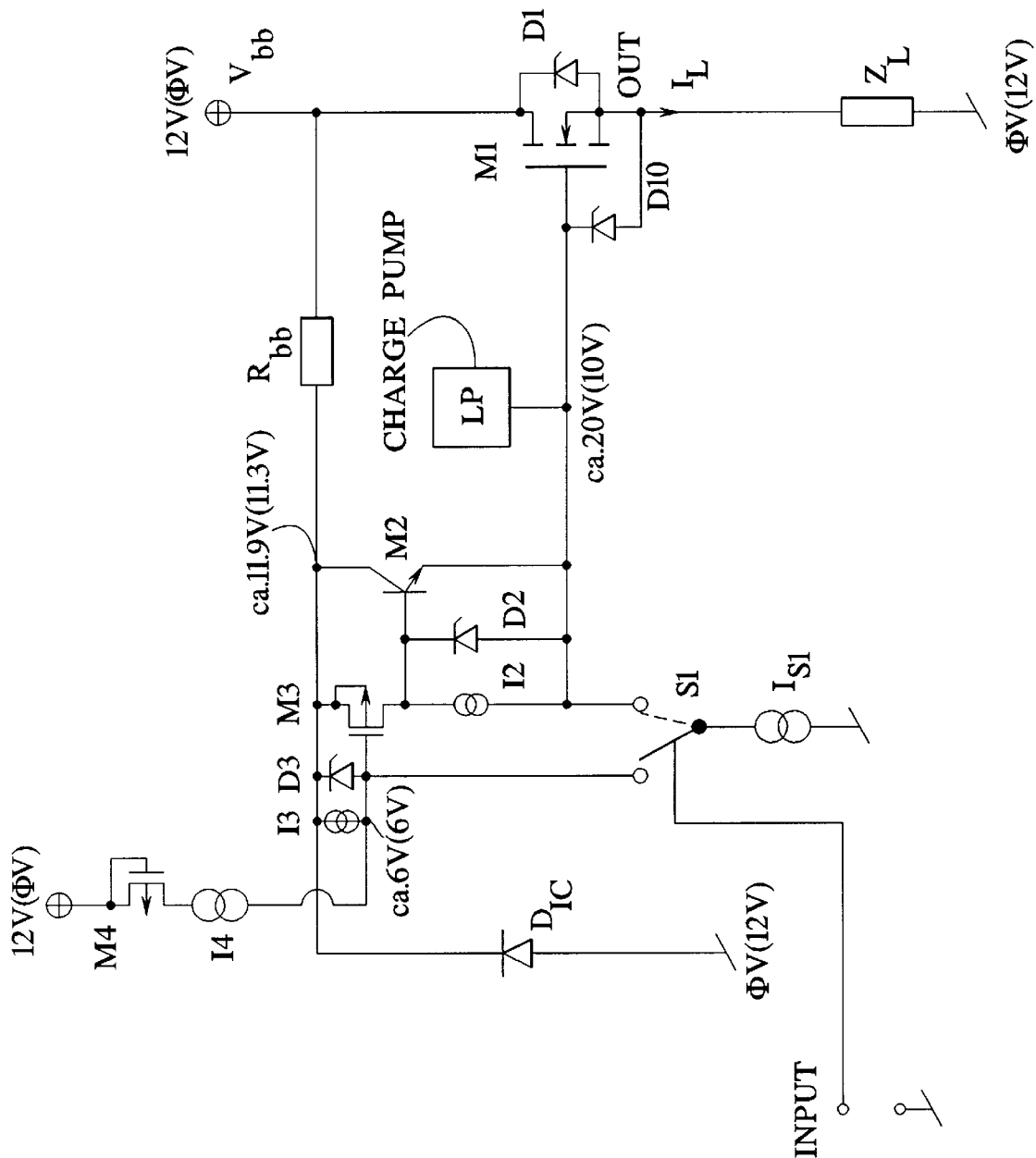

SEMICONDUCTOR SWITCH

BACKGROUND OF THE INVENTION

1. Field of the Invention

The present invention is directed to a semiconductor switch, particularly an MOS high-side power switch, having at least one power transistor for driving a load and a circuit for driving the power transistor via an external control signal.

2. Description of the Prior Art

The problem with such semiconductor switches and, in particular, MOS switches is the technologically conditioned integrated diode in the MOS power transistor. Given a reversal of the operating voltage, this diode conducts the entire load current via the MOS power transistor with at least one diode voltage. This dissipated power is significantly higher than the dissipated power given the proper polarization of the operating voltage when the MOS power transistor is activated and a voltage drop-off, which can be set significantly smaller than the aforementioned diode voltage, is adjacent this transistor. The increased dissipated power of the MOS power transistor must be taken into consideration in the application of the MOS switch; i.e., measures must be undertaken in order to be able to eliminate this dissipated power.

SUMMARY OF THE INVENTION

The present invention is directed toward designing the initially cited semiconductor switch such that a dissipated power that is higher than in the case of proper polarization is avoided given the occurrence of a pole reversal.

According thereto, the inventive measure for avoiding increased dissipated power upon pole reversal requires that the MOS power transistor be activated low-impedance via its gate in the case of such pole reversal as well. It is thereby assured that dissipated power which is greater than that given proper polarization does not occur upon pole reversal, either.

An auxiliary circuit that advantageously includes an MOS or a bipolar transistor inventively serves to activate the MOS power transistor given a reversed power supply; this being connected such that, upon pole reversal, it works as a diode that activates the drive circuit that drives the MOS power transistor via its gate.

The drive circuit can be constructed in an arbitrary way. Advantageously, the drive circuit includes an MOS or a bipolar transistor that is switched on via the switch for the activation of the MOS power transistor and drives a further MOS or bipolar transistor that is connected to the gate of the MOS power transistor.

According to an advantageous development of the present invention, a resistor is connected between the collector/source of the respective transistor of the drive circuit and the voltage supply. The resistance of the resistor is selected such that, upon pole reversal, a high voltage is adjacent the respective collector or at the respective source. Given a pole reversal, this resistor also has the function of limiting the current through a technologically conditioned diode that, given integrated transistors, is connected parallel to these.

Further, protective measures for the respective transistors are advantageously provided; for example, in the form of current-limiting elements that can be designed in a known way as depletion transistors or resistors.

Additional features and advantages of the present invention are described in, and will be apparent from, the Detailed Description of the Preferred Embodiments and the Drawings.

DESCRIPTION OF THE DRAWINGS

FIG. 1 shows an embodiment of the MOS switch circuit in accordance with the teachings of the present invention.

DETAILED DESCRIPTION OF THE PREFERRED EMBODIMENTS

Referring to FIG. 1, the MOS switch includes an MOS power transistor M1 that is connected to a positive supply voltage $V_{bb}$ and to which a load $Z_L$ is connected at the output side. A current $I_L$ is supplied to the latter by the transistor M1.

Values of potential obtained given correct polarization of the operating voltage are indicated with reference to a positive operating voltage of 12 V. The particulars regarding the potentials given a pole reversal are indicated in brackets.

A diode D1 is integrated into the MOS power transistor. This diode D1, as initially explained, conducts the entire load current, $I_L$, over the MOS power transistor M1 under at least one diode voltage in the case of a reversal of the supply voltage $V_{bb}$. As a protective measure, a Zener diode D10 is also connected between the output of the MOS power transistor and its gate.

The MOS switch shown in FIG. 1 also includes a drive circuit that includes the following elements: a switch-over S1 with current-limiting element $I_{S1}$ that lies at ground; a bipolar or MOS transistor M3 with protective circuit element D3 (Zener diode) and I3 (current source); a bipolar or MOS transistor M2, likewise with protective circuit element D2 (Zener diode) and I2 (current source); and a charge pump LP. The current sources I3 and I4 can, for example, be respectively fashioned as resistors.

The switch-over S1 serves for the switching of the MOS power transistor M1 on and off and is driven by the input of the MOS switch via an external control signal. The activated condition of the switch-over S1 is indicated with a solid line in FIG. 1 and the deactivated condition of the switch-over S1 is indicated with broken lines. The activation and deactivation of the MOS power transistor M1 occurs indirectly via the transistor M2 and M3. When the transistor M3 is turned on, given activated switch-over M1, the transistor M3, in turn, switches the transistor M2 on. The emitter of the transistor M2 lies at the gate of the transistor M1. Additionally, the charge pump LP lies at the gate of the transistor M1. This charge pump LP sees to the voltage excess at the gate of the transistor M1 needed, given a high-side switch, in order to switch the transistor M1 to low-impedance via the gate. This represents the functioning of the illustrated MOS switch given correct polarization of the supply voltage.

In addition, measures are also inventively undertaken in order to switch the transistor M1 to low-impedance upon pole reversal. To this end, a high gate voltage at the transistor M1 is required in this reversed operating condition. This is offered by an auxiliary circuit that is composed of a further bipolar or MOS transistor M4 with a protective circuit element I4 (current source in the form of a depletion transistor or resistor) and a resistor $R_{bb}$ that is connected between the supply voltage $V_{bb}$ and the collector of the transistor M2 or, respectively, the source of the transistor M3.

The resistor $R_{bb}$ has two functions. Given a pole reversal, it first limits the current through one or more diodes $D_{IC}$ technologically formed in the MOS switch which is fashioned as an IC in the integrated circuit; it then sees to a high positive voltage at the collector of the transistor M2 and the source of the transistor M3. The activation of the transistor M3 occurs via the transistor M4 of the auxiliary circuit. In the case of pole reversal, the transistor M4 is circuited as an MOS diode and pulls the gate of the transistor M3 to low potential. Accordingly, the protective elements I4 and D3 limit the current to ground. As a result thereof, the transistor M1 is likewise driven low-impedance via its gate given incorrect polarization.

During normal operation, the transistor M4 is shut off, so that no deteriorations of the MOS switch due to the auxiliary circuit need be feared. When, by contrast, the transistor M3 is activated given pole reversal, M2 is also activated and pulls the gate of M1 to high potential. As a result thereof, the transistor M1 is also connected low-impedance and it minimizes the dissipated power in this abnormal operating condition.

Although the present invention has been described with reference to specific embodiments, those of skill in the art will recognize that changes may be made thereto without departing from the spirit and scope of the invention as set forth in the hereafter appended claims.

We claim as our invention:

1. An MOS high-side semiconductor power switch, comprising:
   at least one power transistor for driving a load;
   a first circuit for driving the power transistor via an external control signal by activating the power transistor via the power transistor's gate; and
   an auxiliary circuit for activating the power transistor via the power transistor's gate given a reversed voltage from a voltage supply to the MOS switch.

2. A semiconductor power switch as claimed in claim 1, wherein the auxiliary circuit includes an auxiliary circuit transistor functioning as a diode for activating the first circuit given the reversed voltage.

3. A semiconductor power switch as claimed in claim 2, wherein the auxiliary circuit further includes a current-limiting element connected to the auxiliary circuit transistor.

4. A semiconductor power switch as claimed in claim 1, wherein the first circuit includes a first transistor activated by a switch for driving a second transistor connected to the gate of the power transistor.

5. A semiconductor power switch as claimed in claim 4, wherein the auxiliary circuit further includes a resistor connected between the voltage supply and both a collector of the second transistor and a source of the first transistor, the resistor having a selected resistor value wherein a high voltage is present at both the collector of the second transistor and the source of the first transistor given the reversed voltage.

6. A semiconductor power switch as claimed in claim 5, wherein the first circuit further includes current-limiting elements connected to each of the first and second transistors.

7. A semiconductor power switch as claimed in claim 4, wherein the first circuit further includes current-limiting elements connected to each of the first and second transistors.

* * * * *